(12) United States Patent
Kim et al.

(10) Patent No.: US 6,850,676 B2
(45) Date of Patent: Feb. 1, 2005

(54) OPTICAL FIBER BLOCK PHOTO MASK FOR LOSS REDUCTION

(75) Inventors: Jong-Youl Kim, Kumi-shi (KR); Seung-Jin Baek, Kumi-shi (KR); Jae-Wan Kim, Taegukwangyok-shi (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 138 days.

(21) Appl. No.: 10/193,433

(22) Filed: Jul. 11, 2002

(65) Prior Publication Data

US 2003/0108299 A1 Jun. 12, 2003

(30) Foreign Application Priority Data

Feb. 7, 2001 (KR) .......................................... 2001-77490

(51) Int. Cl.[7] .............................. G02B 6/00; G03F 9/00
(52) U.S. Cl. .............................. 385/52; 385/147; 430/5
(58) Field of Search ....................... 385/147, 52; 430/5; 438/697, 700, 708, 740

(56) References Cited

U.S. PATENT DOCUMENTS 5,632,908 A * 5/1997 Shahid ........................... 216/2

6,544,695 B2 * 4/2003 Wang et al. ..................... 430/5

FOREIGN PATENT DOCUMENTS

JP          58130310 A   *   8/1983   ............ G02B/7/26

* cited by examiner

Primary Examiner—Rodney Bovernick
Assistant Examiner—Juliana K. Kang
(74) Attorney, Agent, or Firm—Cha & Reiter, L.L.C.

(57) ABSTRACT

A photomask is disclosed for the fabrication of an optical fiber block including a first section provided with slit arrays adapted to form an optical fiber alignment region of the optical fiber block while having a uniform slit pitch, partition portions arranged between adjacent ones of the slit arrays while having a pitch larger than the slit pitch, and end portions arranged outside the slit arrays while having a pitch larger than the slit pitch. The photomask also includes a second section adapted to form a stress-reducing recessed region of the optical fiber block etched to a desired depth from the level of the optical fiber alignment region. The photomask also includes auxiliary slit arrays arranged at an interface between the first and second sections. The auxiliary slit array includes at least one slit.

9 Claims, 8 Drawing Sheets

OPTICAL FIBER BLOCK PHOTO MASK FOR LOSS REDUCTION

This application claims priority to an application entitled "OPTICAL FIBER BLOCK PHOTO MASK FOR LOSS REDUCTION" filed in the Korean Industrial Property Office on Dec. 7, 2001 and assigned the Serial No. 2001-77490, the contents of which are hereby incorporated by reference.

BACKGROUND OF THE INVENTION

1. Field of the Invention

The present invention relates to an optical device using a planar lightwave circuit, and more particularly to a photomask used in the manufacture of an optical fiber block adapted to connect an optical fiber to a planar lightwave circuit.

2. Description of the Related Art

Planar lightwave circuits have been frequently used in processing of optical signals. For example, such planar lightwave circuits may be used for the splitting, modulation, switching, and multiplexing of optical signals. In association with such planar lightwave circuits, a number of research efforts have been made to provide an integrated chip in which a waveguide is formed on a planar substrate. In order to fabricate such a planar lightwave circuit chip, it is necessary to use techniques for designing and fabricating a waveguide as well as and packaging techniques. Such planar lightwave circuit chips use optical fiber blocks so that it is coupled with an optical fiber. Such optical fiber blocks are adapted for multiple access. In an optical fiber block, V-grooves are formed at a silicon substrate in accordance with the intrinsic wet etching characteristics of the silicon substrate. Advantageously, such an optical fiber has many applications because its V-grooves can have an accurate pitch.

FIG. 1 illustrates a typical planar lightwave circuit, and optical fiber blocks aligned with and bonded to the planar lightwave circuit. The alignment and bonding of the planar lightwave circuit and optical fiber blocks will be described in conjunction with FIG. 1. In the alignment and bonding structure of the conventional planar lightwave circuit shown in FIG. 1, input and output optical fiber blocks 20 and 30 are arranged at opposite sides of a planar lightwave circuit 10 while being aligned with each other. The input optical fiber block 20 serves to connect a single optical fiber F1 to an input port of the planar lightwave circuit 10. The output optical fiber block 30 serves to connect an optical fiber ribbon F2 to an output port of the planar lightwave circuit 10. In this arrangement, the planar lightwave circuit 10 is connected to the single optical fiber F1 and the optical fiber ribbon F2 by the input and output optical fiber blocks 20 and 30, respectively. The aligned state of the planar lightwave circuit 10 with the input and output optical fiber blocks 20 and 30 is maintained by an adhesive Bo such as epoxy resin.

Referring to FIG. 2, the structure of a photomask used to fabricate one of the input and output optical fiber blocks 20 and 30 will be described. As shown in FIG. 2, a photomask 40 is used to fabricate an optical fiber block in accordance with a photolithography process. The photomask 40 includes two portions, a laser transmission portion BL that allows laser beams to pass therethrough, and a laser shield portion WH that prevents laser beams from passing therethrough. The laser transmission portion BL corresponds to a black portion in FIG. 2. The laser shield portion WH corresponds to a white portion in FIG. 2.

The photomask 40 is divided into two sections, a first section 410 for an optical fiber alignment region of an associated optical fiber block (shown in FIG. 3 or 4), and a second section 420 for a stress-reducing region. The first section 410 is provided with a plurality of slit arrays 401, 402, and 403 each having a desired slit pitch, and portions other than the slit pitches of those slit arrays, that is, portions 405, 406, 407, and 408. In particular, the photomask 40 has a maximum pitch at th& opposite end portions 405 and 406 of the first section 410. The portions 407 and 408 arranged among the slit arrays 401, 402, and 403 have a pitch smaller than that of the end portions 405 and 406. The photomask 40 is adapted for a 24-core optical fiber block.

FIGS. 3 and 4 illustrate an optical fiber block 50 fabricated using the conventional photomask 40 along with a photolithography process. The optical fiber block is an 8-core optical fiber block. The optical fiber block 50 includes an optical fiber alignment region 510, and a stress-reducing recessed region 520. The optical fiber alignment region 510 is provided with a plurality of V-groove arrays 501 each having a plurality of V-grooves 501a at which bare fiber portions of an optical fiber ribbon are arranged. A planar partition portion 503, which has a pitch different from that of the V-grooves 501a, is arranged between adjacent ones of the V-groove arrays 501. Planar end portions 502, which have a pitch different from that of the V-grooves 501a, are also provided at opposite ends of the optical fiber alignment region 510, respectively (only one planar end portion 502 is shown in FIG. 3).

The planar portions 502 and 503 of the optical fiber alignment region 510 have a pitch different from that of the V-grooves 501a and are inevitably formed with protrusions A and B at an interface between the optical fiber alignment region 510 and the stress-reducing recessed region 520. The protrusions A and B extend from the optical fiber alignment region 510 to the stress-reducing recessed region 520. The protrusions A and B are inevitably formed due to the intrinsic crystalline structure of the optical fiber block along with differences in etching rate and etching selectivity exhibited in the optical fiber block during a wet etching process.

An optical fiber ribbon (not shown) is then laid on the optical fiber block 50, fabricated as described above, in an aligned state. In this state, epoxy resin is applied to the optical fiber block 50. The applied epoxy resin flows in directions indicated by the arrows • and • in FIG. 3. As shown in FIGS. 3 and 4, the interface between the optical fiber alignment region 510 and the stress-reducing recessed region 520 has a non-uniform protrusion shape at the portions 503 having a pitch different from that of the V-grooves 501a, and the opposite end portions 502, due to the wet etching process. An enlarged photograph of the protrusions A and B of the optical fiber block is shown in FIG. 5.

The protrusions A and B interfere with the flow of epoxy resin used in a bonding process. In particular, the epoxy resin may be collected at the portions 503 having a pitch different from that of the V-grooves 501a. Furthermore, there are problems in that the optical fiber mounted to the optical fiber block may be subjected to stress, or broken due to a difference in the amounts of epoxy resin respectively applied at different sites for multiple bonding, or a difference in the shrinkage of epoxy resin at different sites when the epoxy resin is cured. Where stress is generated at the optical fiber ribbon, optical loss may occur. In severe cases, the optical fiber may be broken.

SUMMARY OF THE INVENTION

Therefore, an object of the present invention to provide a photomask used in the manufacture of an optical fiber block, which is capable of reducing optical loss occurring at the optical fiber block when the optical fiber block is bonded to a planar lightwave circuit in an aligned state.

Another object of the invention is to provide a photomask used in the manufacture of an optical fiber block, which is fabricated while taking into consideration the intrinsic crystalline structure characteristics of a silicon wafer to be etched to form the optical fiber block.

Another object of the invention is to provide a photomask used in the manufacture of an optical fiber block, which is capable of reducing a connection offset generated when the optical fiber block is connected to a planar lightwave circuit.

In accordance with one embodiment of the present invention, these objects are accomplished by providing a photomask for the fabrication of an optical fiber block including a first section provided with at least two slit arrays adapted to form an optical fiber alignment region of the optical fiber block while having a uniform slit pitch, at least one partition portion arranged between adjacent one of the slit arrays while having a pitch larger than the slit pitch, and end portions arranged outside the slit arrays while having a pitch larger than the slit pitch. A second section is adapted to form a stress-reducing recessed region of the optical fiber block etched to a desired depth from the level of the optical fiber alignment region. The photomask also includes at least one auxiliary slit array arranged at an interface between the first and second sections while extending from the first section toward the second section by a desired length. The auxiliary slit array includes at least one slit.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENT

Now, preferred embodiments of the present invention will be described in detail, with reference to the annexed drawings. In the following description of the present invention, a detailed description of known functions and configurations incorporated herein will be omitted when it may make the subject matter of the present invention rather unclear.

Figure 6:
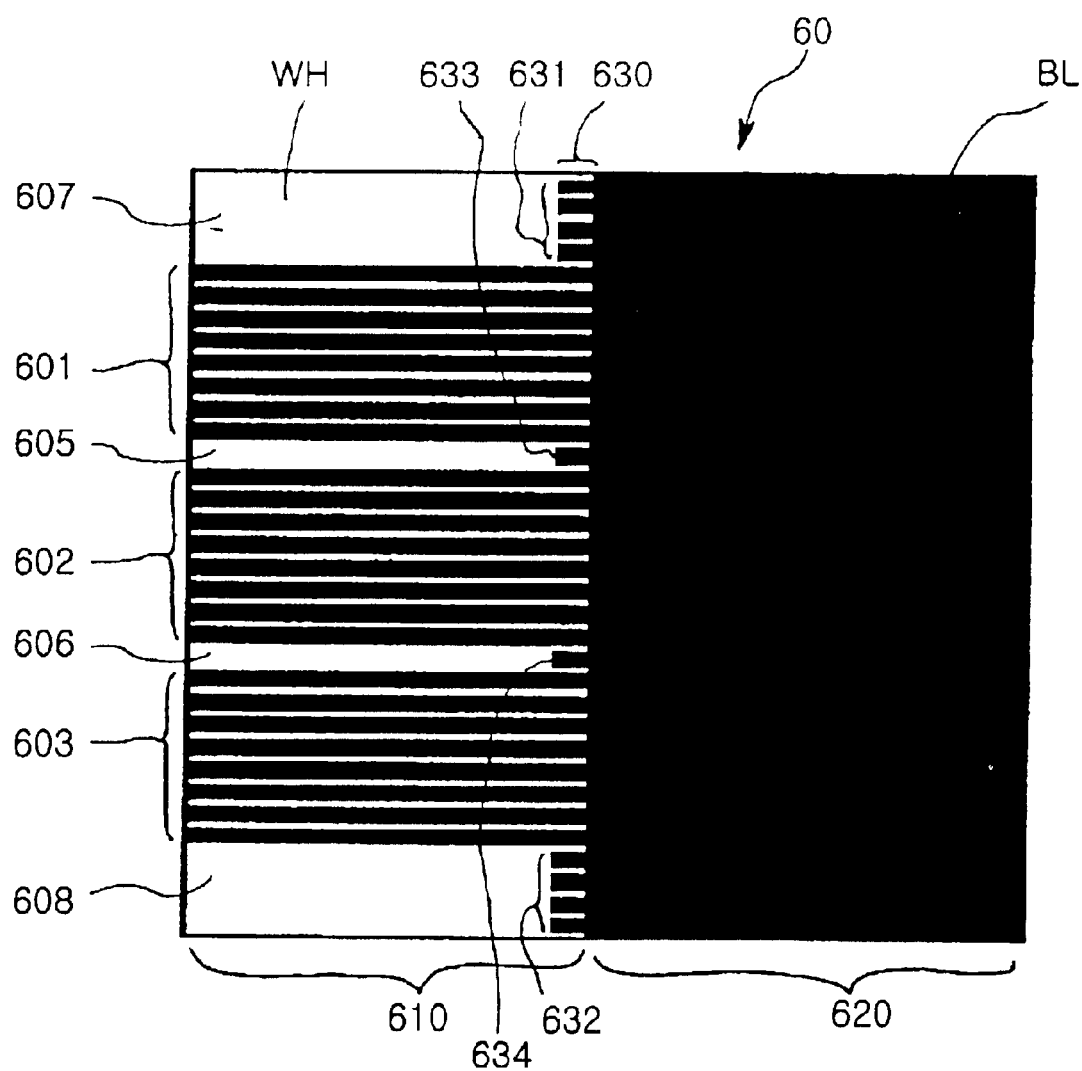
FIG. 6 is a plan view illustrating a photomask according to a preferred embodiment of the present invention.

FIG. 6 is a plan view illustrating a photomask 60 for optical fiber blocks according to a preferred embodiment of the present invention. The photomask 60 is a mask used in the manufacture of an optical fiber block. The photomask 60 includes three sections. The black region BL is a region allowing laser beams to pass therethrough, so as to etch a desired portion of a silicon wafer. The white region WH prevents laser beams from passing therethrough, so as to prevent the silicon wafer from being etched. The etching process for the silicon wafer is a wet etching process.

The photomask 60 has a design corresponding to the design provided on the silicon substrate in accordance with a desired design of the optical fiber block. The photomask 60 shown in FIG. 6 is partially plated with chromium. The chromium-plated portion of the photomask 60 corresponds to the black region BL. The portion of the photomask 60 that are not plated with chromium corresponds to the white region WH.

The three sections of the photomask 60 include a first section 610 adapted to etch V-grooves at which bare fiber portions of an optical fiber ribbon are arranged in an aligned state. A second section 620 is adapted to etch a stress-reducing recessed region for minimizing stress generated due to the coated thickness of the optical fiber ribbon. The third section is formed by at least one auxiliary slit array 630 provided at the interface between the first and second sections 610 and 620.

In the embodiment shown in FIG. 6, the photomask 60 is a mask adapted to fabricate an optical fiber block for supporting a 24-core optical fiber ribbon. It will be understood by one of ordinary skill in the art that the photomask may be adapted for other optical fiber block applications. The photomask 60 has three slit arrays 601, 602, and 603 corresponding to three V-groove arrays, and partition portions 605 and 606 each arranged between adjacent ones of the three slit arrays 601, 602, and 603. End portions 607 and 608 are provided at opposite end portions of the first section 610, respectively.

As shown in the embodiment of FIG. 6, the auxiliary slit array 630 includes auxiliary slit arrays 631 and 632, which are shorter than a length of slits 601, 602, 603 arrange in the first section 610, and are respectively provided at portions of the interface between the first and second section 610 and 620 respectively corresponding to the end portions 607 and 608 of the first section 610. The auxiliary slit array 630 also includes auxiliary slit arrays 633 and 634 respectively provided at portions of the interface between the first and second sections 610 and 620 respectively corresponding to the partition portions 605 and 606 of the first section 610. It can be seen that the auxiliary slit arrays 633, 634 can have a length that is different from a length of slits 603 arranged in the first section 610. Typically, the auxiliary slit arrays 633, 634, arranged in respective partition portions 605, 606, are shorter than the slits 603 arranged in the first section 610. The slit pitch of the auxiliary slit arrays 630 are the same as that of the slit arrays 601, 602, and 603.

Figure 1:
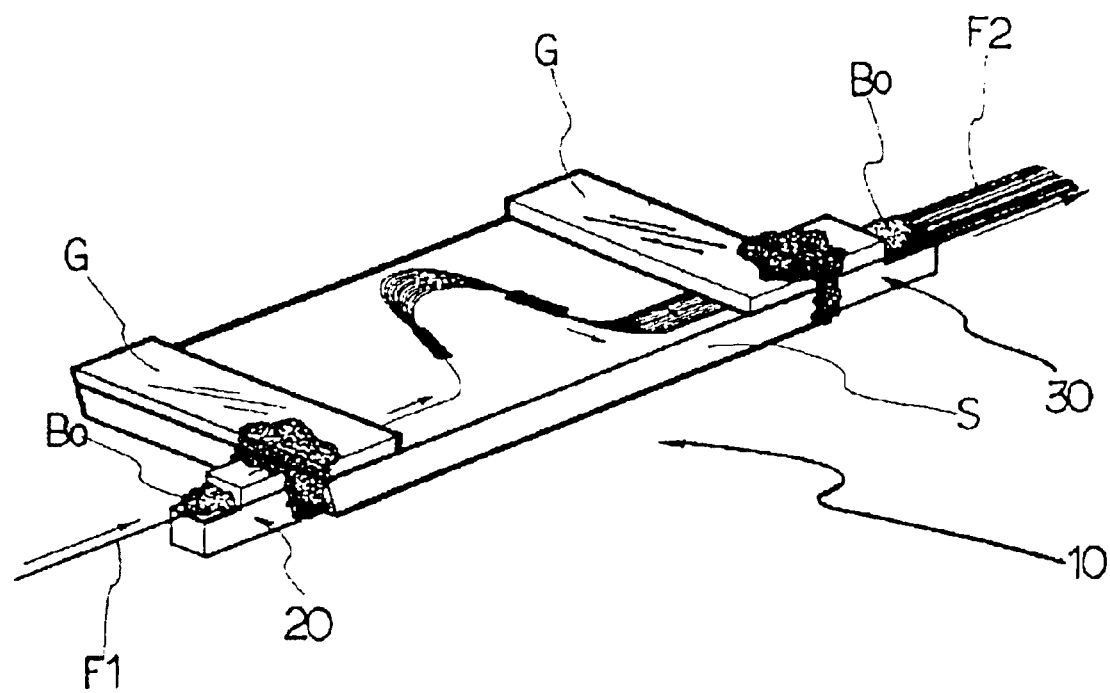
FIG. 1 is a perspective view illustrating a typical planar lightwave circuit, and optical fiber blocks aligned with and bonded to the planar lightwave circuit.
Figure 2:
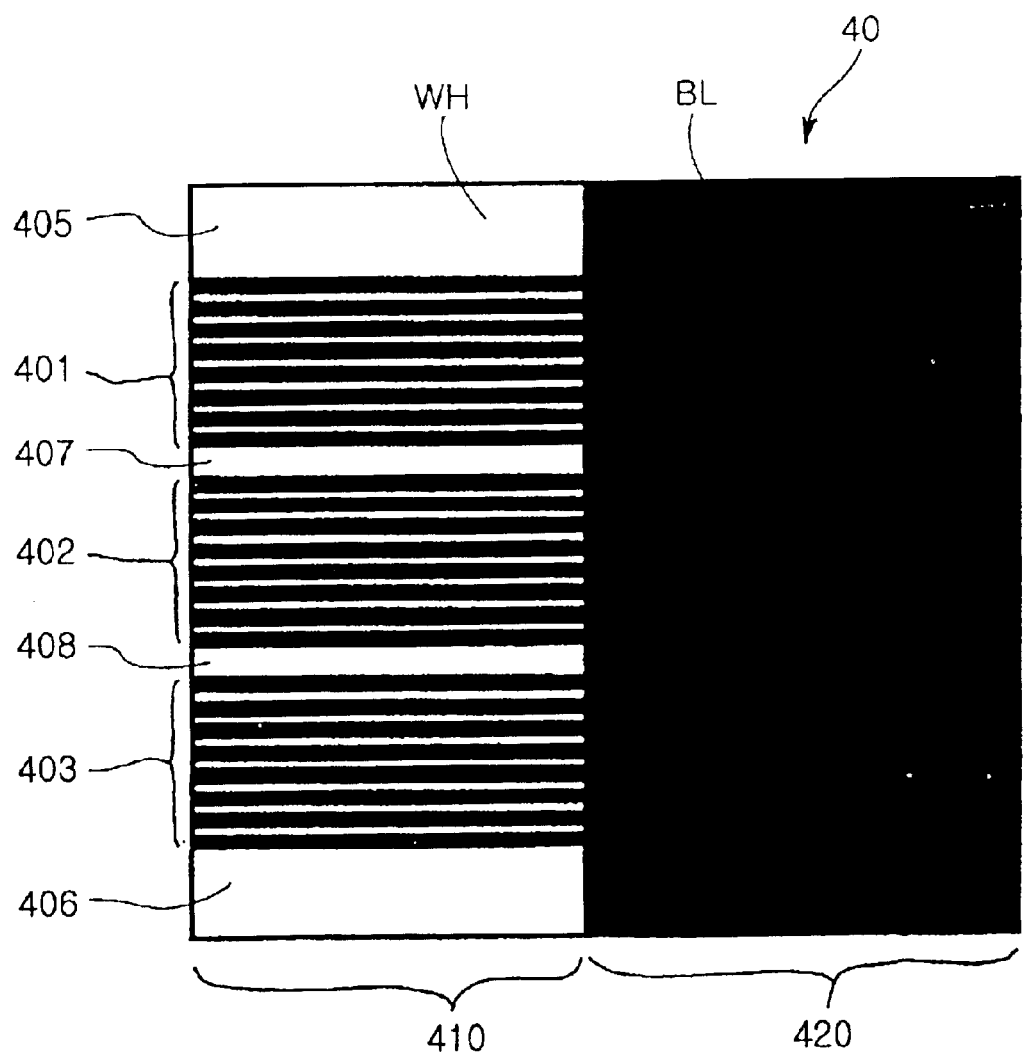
FIG. 2 is a plan view illustrating a conventional photomask.
Figure 3:
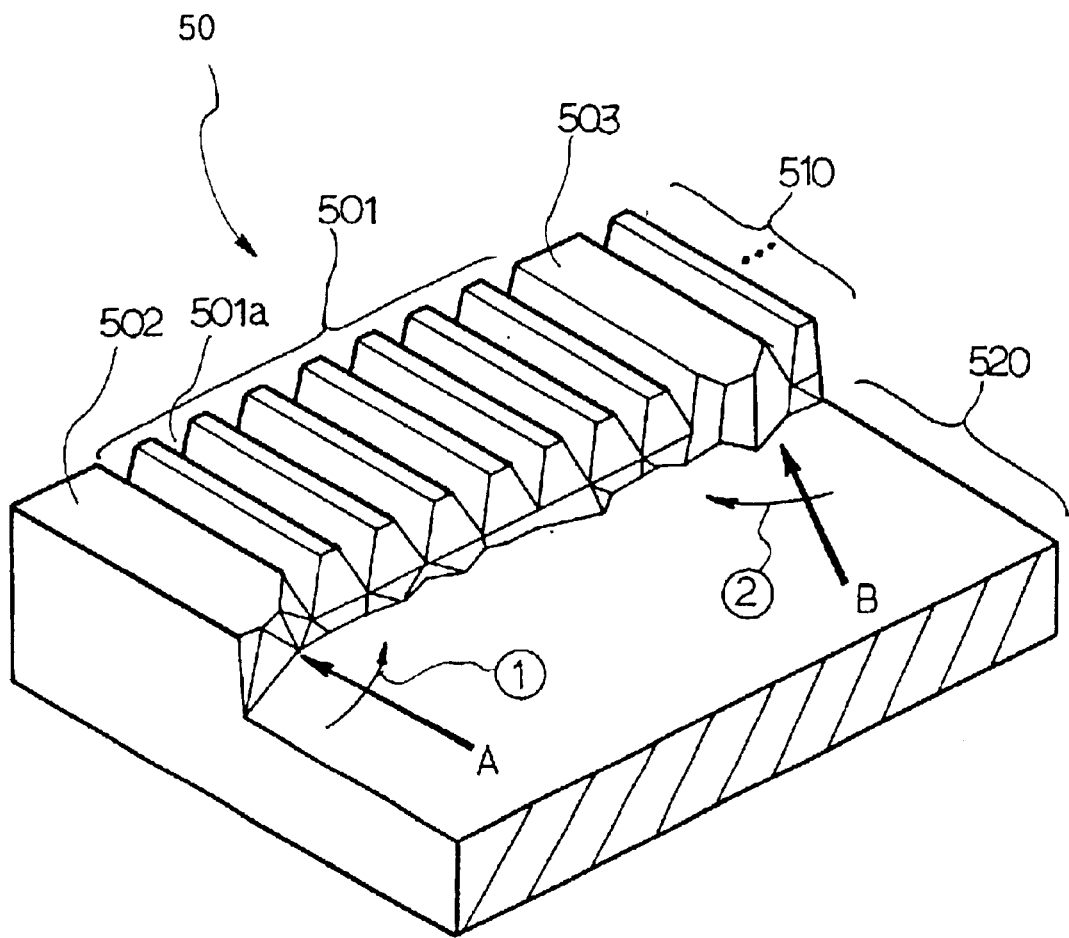
FIG. 3 is a perspective view illustrating an optical fiber block fabricated using the conventional photomask.
Figure 4:
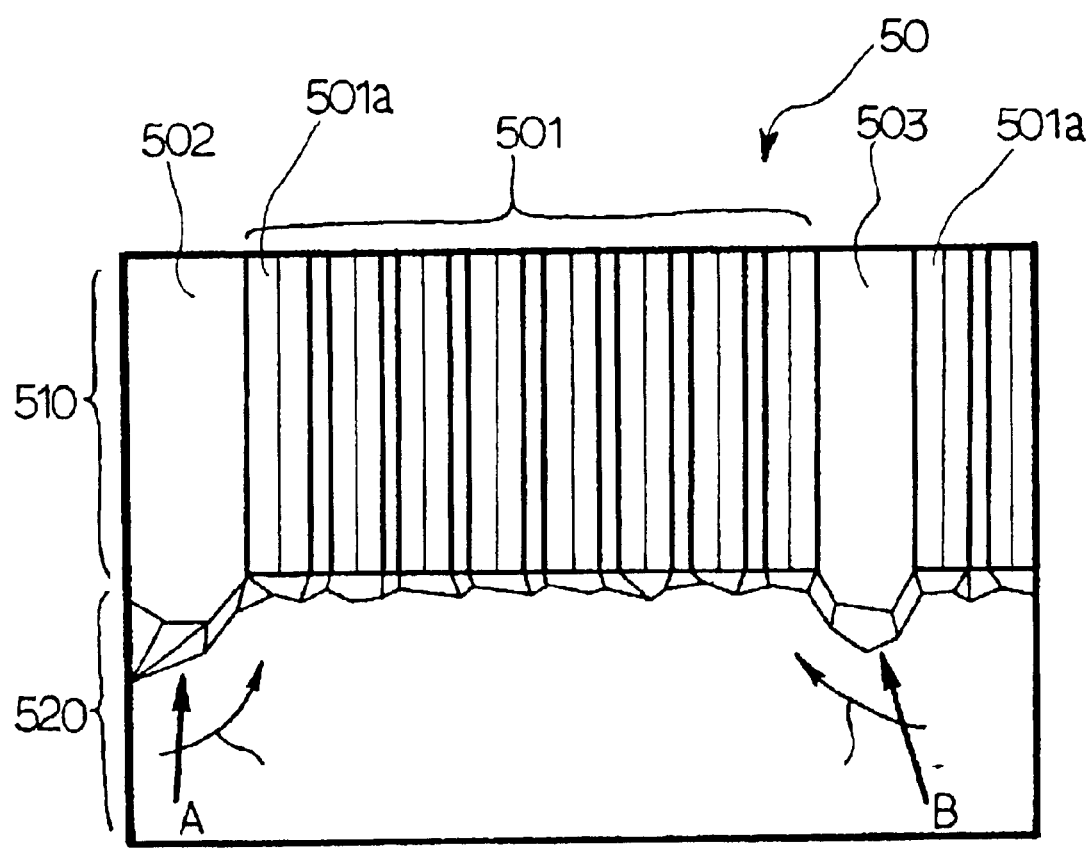
FIG. 4 is a plan view corresponding to FIG. 3.
Figure 5:
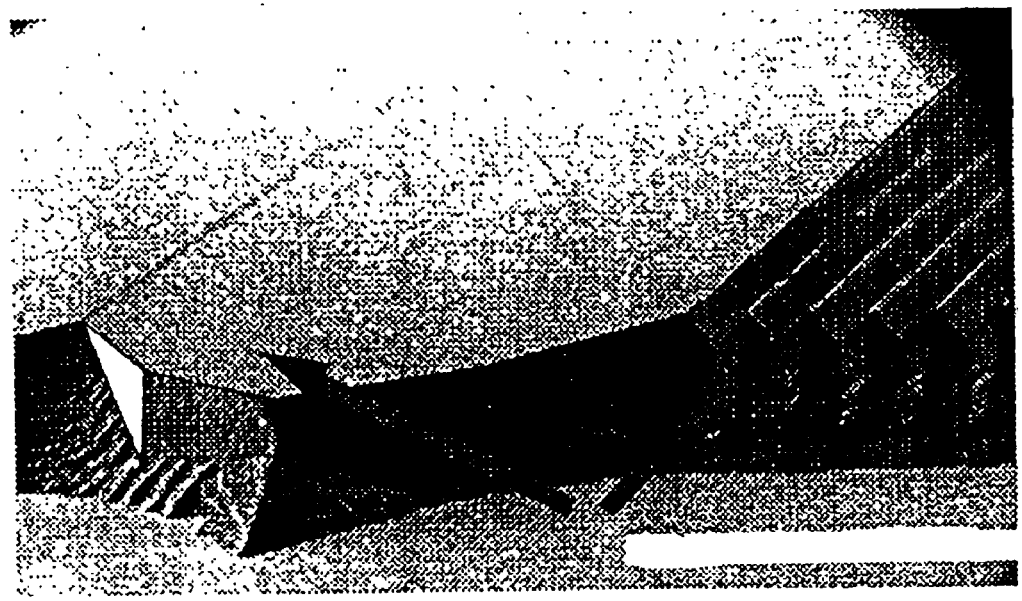
FIG. 5 is an enlarged photograph of protrusions formed at the optical fiber block fabricated using the conventional photomask.
Figure 7:
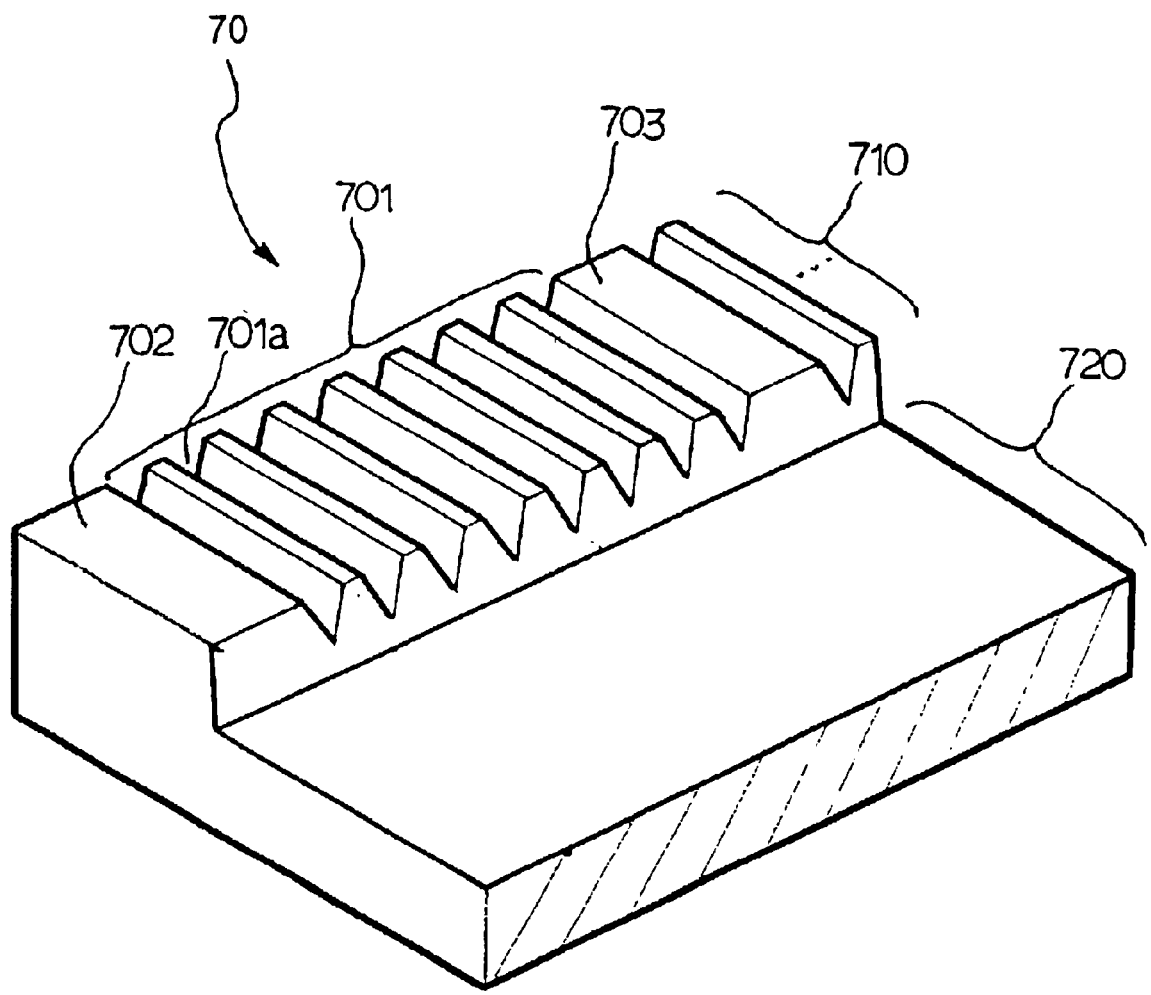
FIG. 7 is a perspective view illustrating an optical fiber block fabricated using the photomask according to the preferred embodiment of the present invention.
Figure 8:
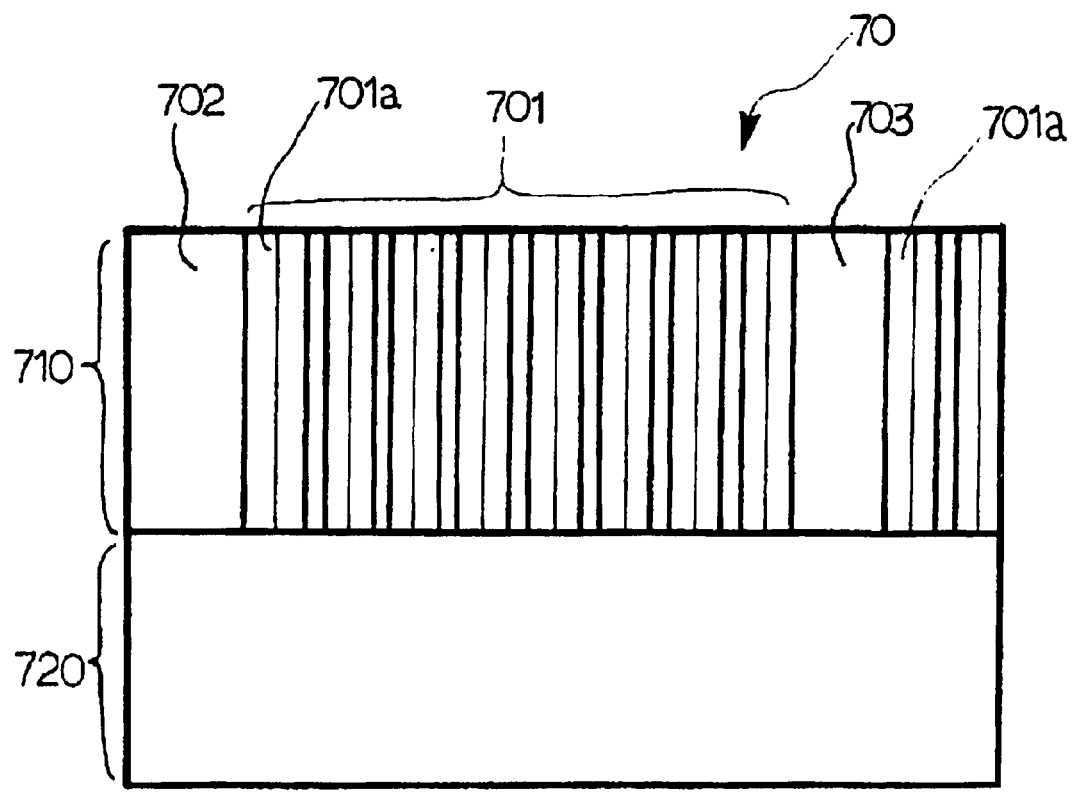
FIG. 8 is a plan view corresponding to FIG. 7.

As a silicon wafer is wet etched using the photomask 60, an optical fiber block 70 is fabricated, as shown in FIGS. 7 and 8. The optical fiber block 70 of FIG. 7 has no or little possibility of forming protrusions at portions of the interface between the first and second sections 610 and 620 corresponding to the partition and end portions of the first section 610 having pitches different from the slit pitch, as compared to the conventional optical fiber block 50 shown in FIG. 3 in which the protrusions A and B are formed at those interface portions.

The optical fiber block 70 includes an optical fiber alignment region 710, and a stress-reducing recessed region 720 etched to a desired depth from the level of the optical fiber alignment region 710. The optical fiber alignment region 710 is provided with a plurality of V-groove arrays 701 each having a plurality of V-grooves 701a at which bare fiber portions of an optical fiber ribbon (not shown) are arranged. In FIGS. 7 and 8, V-grooves are provided. Planar partition portions 702 and 703 are arranged between adjacent ones of the V-groove arrays 701, respectively. Non-bare fiber portions of the optical fiber ribbon are arranged at the stress-reducing recessed region 720.

Once the optical fiber ribbon is arranged on the optical fiber block in an aligned state, bonding of the optical fiber ribbon is carried out using an adhesive such as epoxy resin. Thus, the optical fiber ribbon is firmly bonded to the optical fiber block after a desired time elapses.

The Protrusions, which may be formed during the fabrication of an optical fiber block using the above mentioned conventional photomask are eliminated or substantially reduced. This also saves the need of removing the protrusions using a separate dicing blade.

While the present invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

As apparent from the above description, the present invention provides a photomask which makes it possible to fabricate an optical fiber block involving no phenomenon that epoxy resin applied in an aligned state of an optical fiber ribbon with V-grooves formed at the optical fiber block forms a puddle, while being capable of preventing a concentration of stress at the optical fiber, and breakage of the optical fiber. Thus, it is possible to minimize optical loss when the optical fiber block is connected to a planar lightwave circuit because there is no stress concentration.

What is claimed is:

1. A photomask for the fabrication of an optical fiber block comprising:

a first section provided with at least two slit arrays adapted to form an optical fiber alignment region of the optical fiber block having a uniform slit pitch;

at least one partition portion arranged between adjacent ones of the slit arrays having a pitch larger than the slit pitch;

end portions arranged outside the slit arrays having a pitch larger than the slit pitch;

a second section adapted to form a stress-reducing recessed region of the optical fiber block etched to a desired depth from a level of the optical fiber alignment region; and at least one auxiliary slit array arranged at an interface between the first and second sections, the auxiliary slit array including at least one slit having a length that is different from a length of slits arranged in the slit arrays in the first section.

2. The photomask according to claim 1, wherein the auxiliary slit array is arranged at a portion of the interface corresponding to each of the end portions.

3. The photomask according to claim 1, wherein the auxiliary slit array is arranged at a portion of the interface corresponding to the partition portion.

4. The photomask according to claim 1, wherein the auxiliary slit array has the same slit pitch as the slit array.

5. The photomask according to claim 1, wherein the auxiliary slit array extends from the second section into the first section a predetermined length.

6. The photomask according to claim 1, further comprising an auxiliary slit array arranged at a portion of the interface corresponding to said at least one partition portion, wherein at least one slit of the slit array arranged in said at least one partition portion has a length that is different from a length of slits arranged in the slit arrays in the first section.

7. The photomask according to claim 1, wherein the length of the at least one slit in the slit array arranged in the interface is shorter than a length of slits arranged in the first section.

8. The photomask according to claim 6, wherein the length of the at least one slit in the slit array arranged in said at least one partition portion is shorter than a length of slits arranged in the first section.

9. The photomask according to claim 8, wherein said at least one partition portion comprises a plurality of partition portions, each respective portion having a slit array of at least one slit portion is shorter than a length of slits arranged in the first section.

* * * * *

UNITED STATES PATENT AND TRADEMARK OFFICE
CERTIFICATE OF CORRECTION

PATENT NO. : 6,850,676 B2
DATED : February 1, 2005
INVENTOR(S) : Jong-Youl Kim, Seung-Jin Baek and Jae-Wan Kim It is certified that error appears in the above-identified patent and that said Letters Patent is hereby corrected as shown below:

<u>Title page,</u>
Item [30], Foreign Application Priority Data, insert -- December 7, 2001 --

Signed and Sealed this

Third Day of May, 2005

JON W. DUDAS
*Director of the United States Patent and Trademark Office*